United States Patent
Lin et al.

(10) Patent No.: US 6,294,432 B1
(45) Date of Patent: Sep. 25, 2001

(54) SUPER HALO IMPLANT COMBINED WITH OFFSET SPACER PROCESS

(75) Inventors: Tony Lin; Jih-Wen Chou, both of Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/467,632

(22) Filed: Dec. 20, 1999

(51) Int. Cl.[7] .................................................. H01L 21/336
(52) U.S. Cl. ........................... 438/301; 438/303; 438/305
(58) Field of Search .................................... 438/224, 199, 438/232, 305, 303, 300, 301

(56) References Cited

U.S. PATENT DOCUMENTS

| | | | |
|---|---|---|---|
| 5,492,847 | * | 2/1996 | Kao et al. ............................... 437/44 |
| 5,595,919 | * | 1/1997 | Pan ......................................... 437/29 |
| 5,736,446 | * | 4/1998 | Wu ........................................ 438/305 |
| 5,759,901 | * | 6/1998 | Loh et al. .............................. 438/305 |
| 5,930,615 | * | 7/1999 | Manning ................................ 438/232 |
| 6,046,472 | * | 4/2000 | Ahmad et al. ........................ 257/336 |
| 6,049,114 | * | 4/2000 | Maiti et al. ............................ 257/412 |
| 6,051,458 | * | 4/2000 | Liang et al. ........................... 438/224 |
| 6,083,783 | * | 7/2000 | Lin et al. .............................. 438/199 |
| 6,190,981 | * | 2/2001 | Lin et al. .............................. 438/305 |

\* cited by examiner

*Primary Examiner*—John F. Niebling
*Assistant Examiner*—Walter L. Lindsay, Jr.
(74) *Attorney, Agent, or Firm*—Bacon & Thomas

(57) ABSTRACT

A method for forming a semiconductor structure by using super halo implant combined with offset spacer process is disclosed. This invention comprises providing a substrate with a gate electrode formed thereon and a halo implant region formed therein. Then, a dielectric layer is deposited on the substrate and the gate electrode. Next, the semiconductor structure is annealed, and the dielectric layer is anisotropically etched to form an offset spacer.

15 Claims, 5 Drawing Sheets

SUPER HALO IMPLANT COMBINED WITH OFFSET SPACER PROCESS

BACKGROUND OF THE INVENTION

1. Field of the Invention

The present invention generally relates to a method for forming integrated circuits, and more particularly to a method for forming semiconductor device by using super halo implant combined with offset spacer process.

2. Description of the Prior Art

As MOS (Metal-Oxide-Semiconductor) device scaled down to sub-0.25 μm, in order to maintain enough short channel margin, tilt angle halo implant is necessary. Unfortunately, the poly spacing is also shrunk, it dose strictly limit halo tilt angle. Thus, super halo process has been proposed. Super halo process uses zero angle halo implant after poly has been defined, then lateral diffusion is performed by using thermal anneal. Following description will set forth an exemplary process of super halo process with the aid of FIG. 1A to FIG. 1D.

Referring to FIG. 1A, a substrate 100 is provided with gate oxide layer 120 and poly gate 130 formed thereon. Thus, two gate electrodes formed in an active area defined in between the isolation regions (not shown in the FIGURE). The gate oxide layer 120 is a layer of insulation to separate poly gate 130 and substrate 100. Source and drain regions will be formed in the substrate 100 at opposite ends of the gate 130. A channel region under the gate electrode 130 is located between the source and drain regions in the substrate 100. Then, super halo implant is preformed to form implant regions 112, as shown in FIG. 1B. The implant regions 112 in the substrate 100 are placed to completely separate the source and drain regions from the channel regions for improving short channel effect. The implant step needs to be performed twice, one for NMOS and the other for PMOS, and then two masks and lithography processes are applied. After the super halo implant steps, such as anneals, cause the halo dopant diffuse toward the channel region.

Subsequently, as shown in FIG. 1C, another implant occurs. This implant step is to form source/drain extension regions 114. The amount of dopant is controlled so that the dopant concentration is relatively low to source and drain regions, and the junction depth is controlled relative shallow to source/drain regions. Then, a thermal anneal is performed so that the dopant diffuses toward the area under gate electrode 130 and the gate to drain overlap will increase. Then, spacer 122 is formed on the sidewall of the gate 130, and again another implant is performed to form source/drain regions 116, as shown in FIG. 1D. The processes which follow are salicide process and backend process.

By the way, the formulation of source/drain extension region and super halo implant must be separated because of shallow junction issue. It means that the super halo process needs to increase two mask steps (one for NMOS and the other for PMOS).

SUMMARY OF THE INVENTION

In accordance with the present invention, a method is provided for forming semiconductor devices that substantially combines super halo implant and offset spacer process. The super halo process in the present invention provides more lateral diffusion by combining offset spacer and can obtain better device performance for shorter channel margin.

It is another object of this invention that super halo anneal can be replaced by offset spacer deposition temperature. Thus, the thermal cycle can be reduced.

It is a further object of this invention to reduce the gate to drain overlap region to improve device performance in offset spacer process.

In one embodiment, a method for forming a metal-oxide-semiconductor device by using super halo combined with offset spacer process is disclosed. The method includes first providing a substrate having a gate electrode formed thereon and a halo implant region formed therein. Secondly, a dielectric layer is deposited on the substrate and the gate electrode. Thirdly, anneal is performed so that dopant of halo implant will diffuse. Fourth, the dielectric layer is anisotropically etched to form an offset spacer. Fifth, source/drain extension regions are formed. Finally, a spacer is formed on the sidewall of the offset spacer beside the gate electrode, and source/drain regions are formed in the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
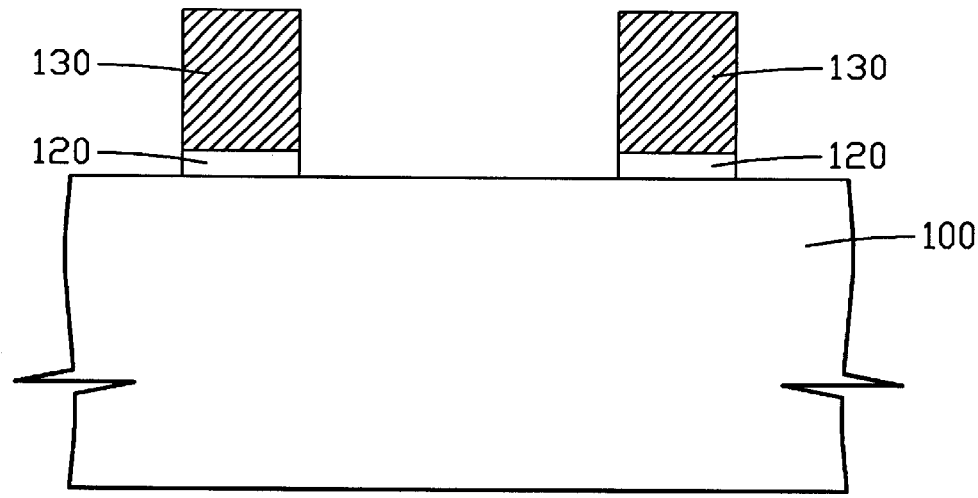
FIGS. 1A to 1D are schematic representations of structures at various stages during the formulation of a semiconductor device using conventional, prior art techniques.
Figure 1B:
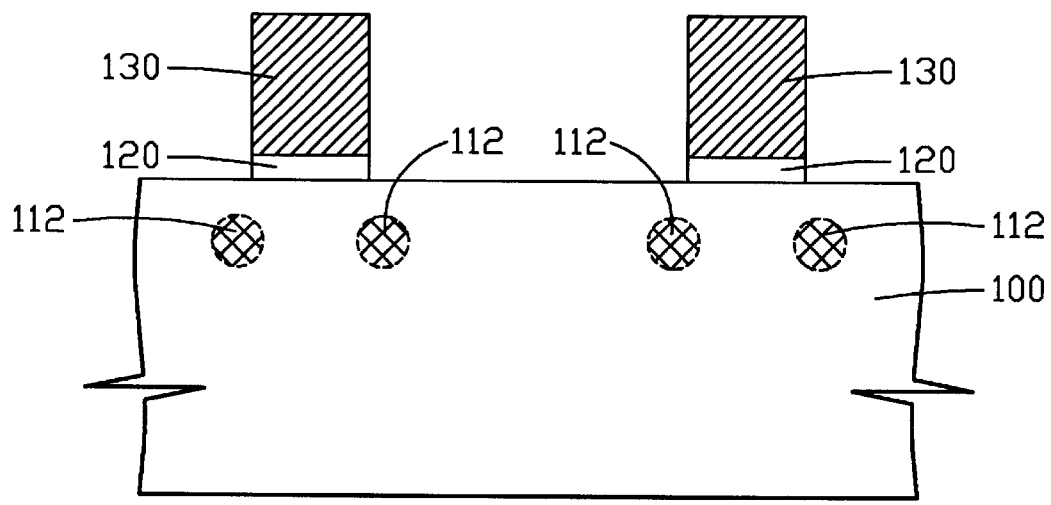
Figure 1C:
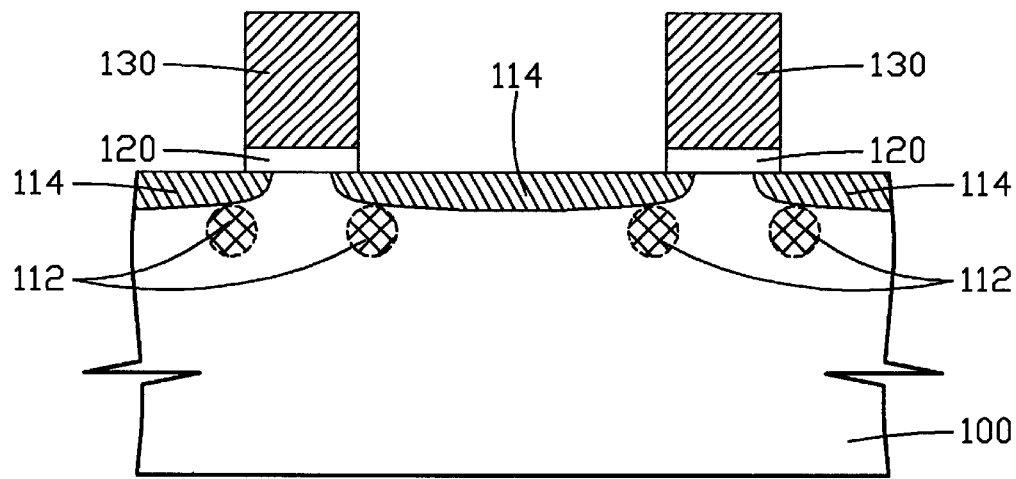
Figure 1D:
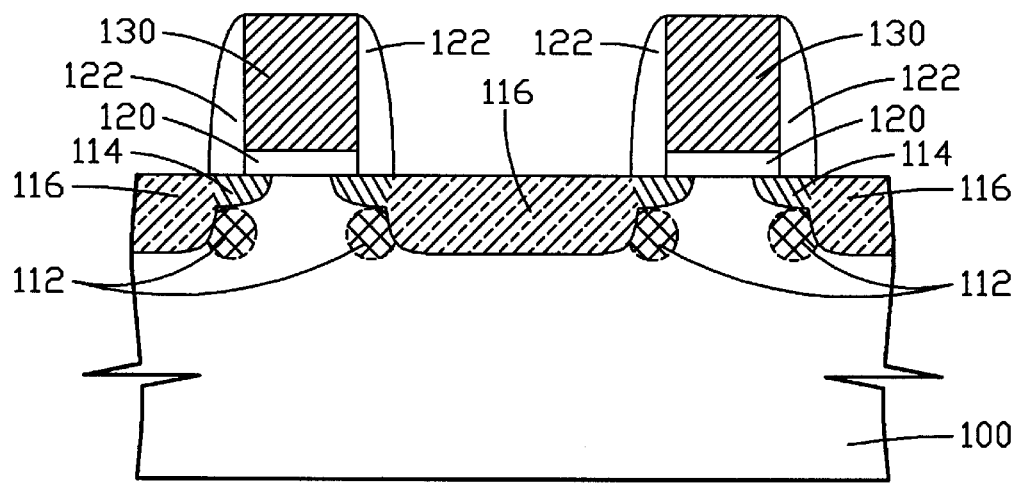

Some sample embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

In this invention, a method for forming semiconductor device comprises super halo implant combined with offset spacer process. By using this invention, on 0.18 μm generation, the poly CD (critical dimension) can be reduced to 0.15 pim, and super halo implant can be adopted, too. Thus, we can obtain more lateral halo profile and larger poly spacing. Then, followed by offset spacer formation and source/drain extension implantation. The following will set forth the present invention with a preferred embodiment and the FIGS. 2A to 2E.

Figure 2A:
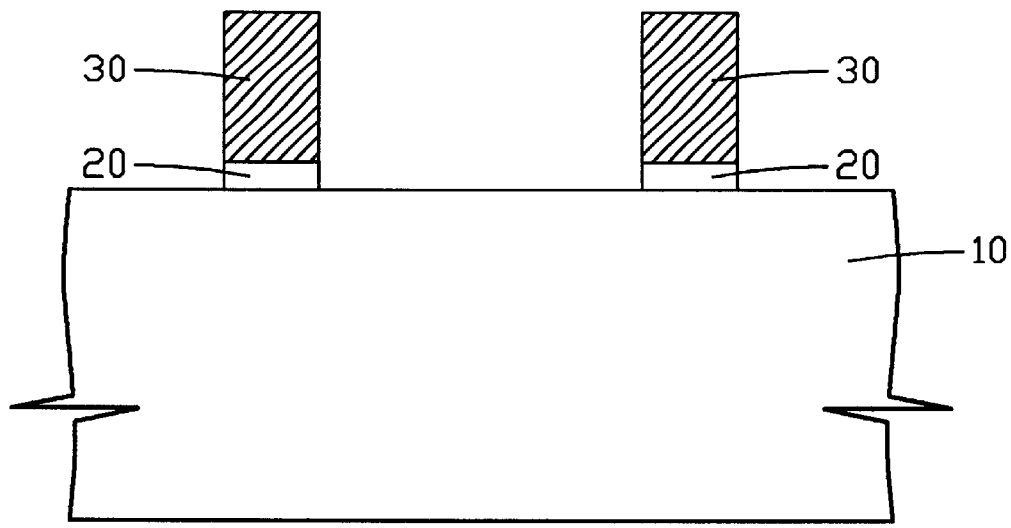
FIGS. 2A to 2E are schematic representations of structures at various stages during the formulation of a semiconductor device in accordance with a method disclosed.

Referring to FIG. 2A, a substrate 10 of a first conductivity type is provided with two gate electrodes formed thereon. The gate electrodes comprises a gate oxide layer 20 and a poly gate layer 30, in which gate oxide layer 20 is silicon oxide and poly gate 30 is polysilicon. The gate oxide layer is the layer of insulation to separate the substrate 10 and the poly gate 30. The method of forming the gate structure is to form a silicon oxide layer and a polysilicon layer sequentially and then to etch a portion of the polysilicon layer and the silicon oxide layer.

The two gate electrodes formed here are in an active area defined in between the isolation regions (not shown in the FIGURE), and the CD can be 0.15 μm generation. Source and drain regions will be formed in the substrate 10 at opposite ends of the gate 30. A channel region under the gate electrode 30 is located between the source and drain regions in the substrate 10.

Figure 2B:
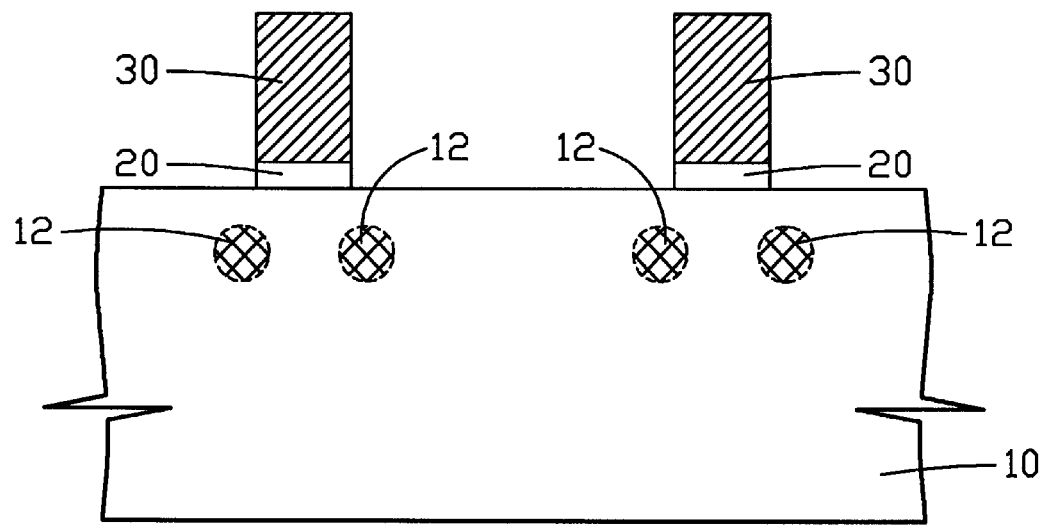

Subsequently, as shown in FIG. 2B, an implant follows. This implant is halo implant. The implant regions 12 in the substrate 10 are placed to completely separate the source and drain regions from the channel regions for improving short channel effect. The dopant is a first conductivity type that is implanted to produce an intermediate concentration level. The dopant material for the halo implant is selected to be more diffusive than the dopant material of second conductivity type residing in the source/drain regions.

Figure 2C:
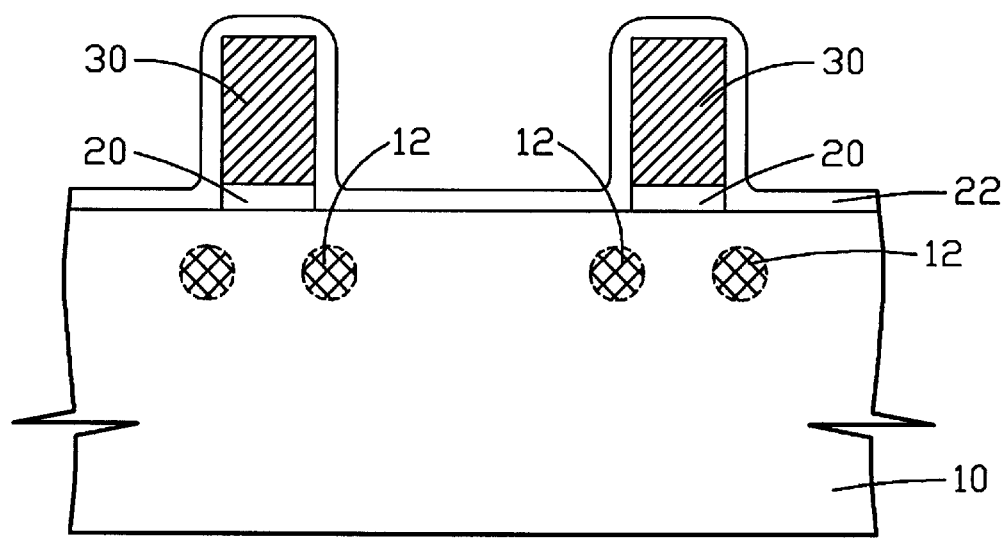

Then, a blanket dielectric layer 22 is deposited on the substrate 10 and the gate structure 30 by using any conventional method, as shown in FIG. 2C. The dielectric layer 22 is used to form offset spacer and has a thickness between about 100 to 500 angstroms. The material of this dielectric layer 22 is usually silicon oxide, and can be silicon nitride. Next, a thermal anneal is performed to make the halo dopant diffuse toward the channel region.

Figure 2D:
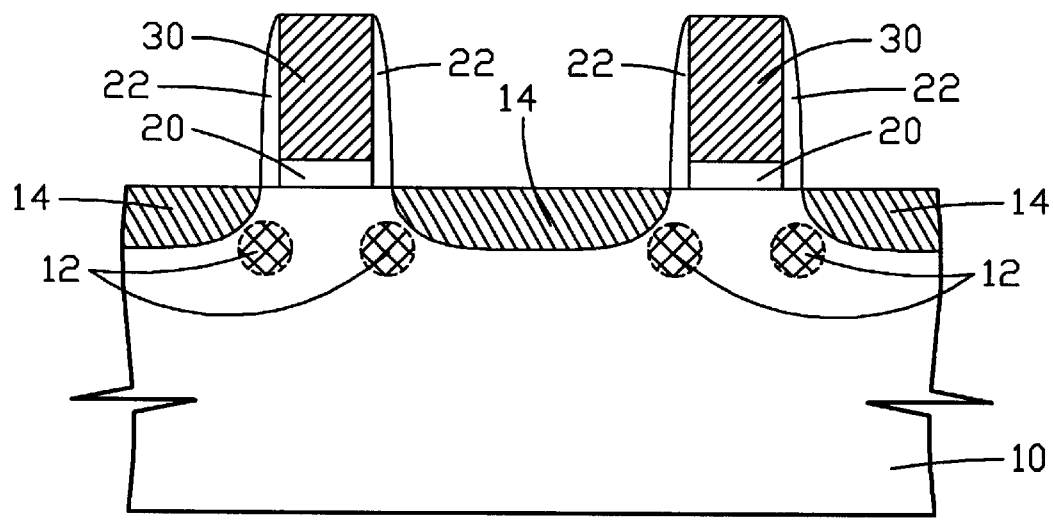

Referring to FIG. 2D, an anisotropically etching is performed to form the offset spacer 22, and an implant then follows to form source/drain extension regions 14 by using the gate electrode 30 with the offset spacer 22 as a mask. The anisotropically etching is any conventional method, such as RIE (Reactive Ion Etching), and this implant is of second conductivity type. The amount of dopant is controlled so that the dopant concentration is relatively low to source and drain regions, and the junction depth is controlled relative shallow to source/drain regions.

Figure 2E:
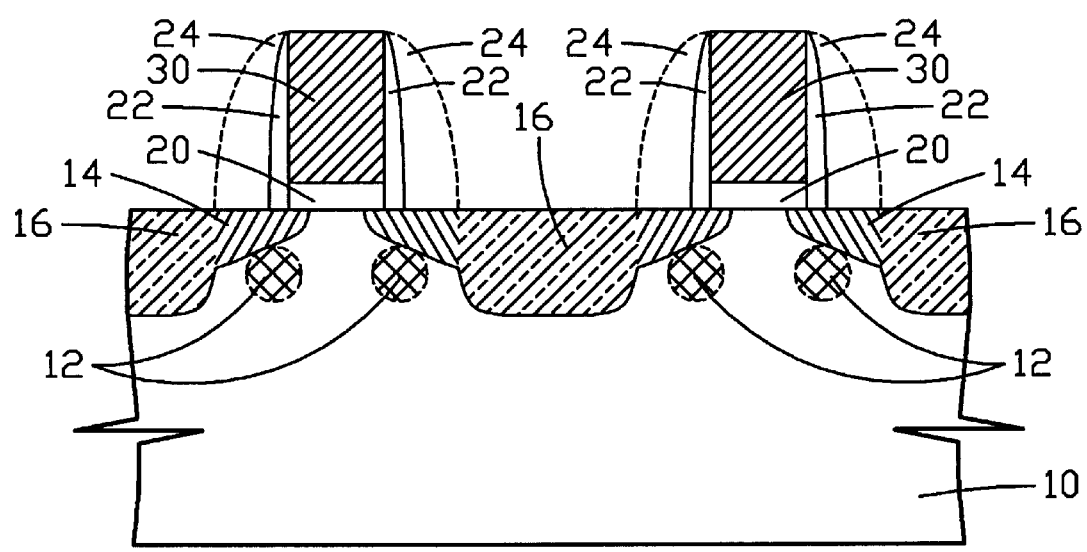

Next, a spacer 24 is formed on the sidewall of the gate structure 30 with the offset spacer 22 by using the same method of forming offset spacer 22, and again another implant is performed to form source/drain regions 16, as shown in FIG. 2E. The source/drain regions 16 are of second conductivity type and the amount of dopant is controlled so that the dopant concentration is relatively high in respect to source/drain extension regions 14. The following processes are salicide process and backend process.

In accordance with the present invention, the super halo implant provides more lateral diffusion by combining offset spacer and can obtain better device performance for shorter channel margin. Moreover, the super halo anneal can be replaced by offset spacer deposition temperature in this invention, and the thermal cycle can be reduced. Further, this invention reduces the gate to drain overlap region to improve device performance in offset spacer process.

Although specific embodiments have been illustrated and described, it will be obvious to those skilled in the art that various modifications may be made without departing from what is intended to be limited solely by the appended claims.

What is claimed is:

1. A method for forming a semiconductor device by using halo implant combined with offset spacer process, wherein said semiconductor device is formed on a wafer, said method comprising:

providing a substrate having a gate electrode formed thereon and a halo implant region formed therein;

depositing a dielectric layer on said substrate and said gate electrode;

annealing said wafer;

anisotropically etching said dielectric layer to form an offset spacer;

implanting ions into said substrate to form source/drain extension regions;

forming a spacer on the sidewall of said gate; and implanting ions into said substrate to form source/drain regions.

2. The method according to claim 1, wherein said substrate comprises silicon.

3. The method according to claim 1, wherein said dielectric layer comprises silicon oxide.

4. The method according to claim 1, wherein said halo implant region is formed by super halo process.

5. The method according to claim 1, further comprising performing a salicide process on said gate and said source/drain regions.

6. A method for forming a semiconductor device, said method comprising:

providing a semiconductor structure having a semiconductor substrate, wherein a gate electrode is formed on the substrate;

forming a halo implant region in said substrate under said gate electrode;

depositing a dielectric layer on said semiconductor structure;

annealing said semiconductor structure;

anisotropically etching said dielectric layer to form an offset spacer;

implanting ions into said substrate to form source/drain extension regions;

forming a spacer on the sidewall of said gate; and implanting ions into said substrate to form source/drain regions.

7. The method according to claim 6, wherein said substrate comprises silicon.

8. The method according to claim 6, wherein said dielectric layer comprises silicon oxide.

9. The method according to claim 6, wherein said halo implant region is formed by super halo process.

10. The method according to claim 6, further comprising performing a salicide process on said gate and said source/drain regions.

11. A method for forming a metal-oxide-semiconductor transistor having a channel of a predetermined channel conductivity type, said channel defining a channel region, said metal-oxide-semiconductor transistor having a source and a drain of a source conductivity type opposite said channel conductivity type, said source defining a source region, said drain defining a drain region, said method comprising:

providing a substrate;

forming a gate electrode on said substrate;

implanting a halo dopant of said channel conductivity type to a halo implant region in said substrate under said channel;

depositing a dielectric layer on said substrate and said gate electrode;

annealing said substrate;

anisotropically etching said dielectric layer to form offset spacer;

forming source/drain extension regions;

forming a spacer on the sidewall of said offset spacer beside said gate electrode; and forming source/drain regions in said substrate.

12. The method according to claim 11, wherein said substrate comprises silicon.

13. The method according to claim 11, wherein said dielectric layer comprises silicon oxide.

14. The method according to claim 11, wherein said halo implant region is formed by super halo process.

15. The method according to claim 11, further comprising performing a salicide process on said gate and said source/drain regions.

* * * * *